(12) United States Patent
Rofougaran et al.

(10) Patent No.: US 8,027,656 B2
(45) Date of Patent: *Sep. 27, 2011

(54) METHOD AND SYSTEM FOR A DISTRIBUTED TRANSCEIVER FOR HIGH FREQUENCY APPLICATIONS

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 937 days.

This patent is subject to a terminal disclaimer.

(21) Appl. No.: 11/860,207

(22) Filed: Sep. 24, 2007

(65) Prior Publication Data

US 2009/0081981 A1 Mar. 26, 2009

(51) Int. Cl.
*H04B 1/26* (2006.01)
(52) U.S. Cl. .......................... 455/316; 455/323; 455/334
(58) Field of Classification Search .......... 455/313–316, 455/323, 334, 339, 341
See application file for complete search history.

(56) References Cited

U.S. PATENT DOCUMENTS

| 4,453,137 | A * | 6/1984 | Rittenbach ........................ 331/2 |
| 2003/0087619 | A1* | 5/2003 | Maruyama et al. ............ 455/260 |
| 2005/0003773 | A1* | 1/2005 | Cowley et al. ............. 455/150.1 |
| 2007/0026832 | A1 | 2/2007 | Someya |
| 2009/0081982 | A1* | 3/2009 | Rofougaran et al. ......... 455/313 |

FOREIGN PATENT DOCUMENTS

CN 1574609 2/2005

OTHER PUBLICATIONS

Nan Guo, Robert C. Qiu, Shaomin S. Mo, and Kazuaki Takahashi, "60-GHz Millimeter-Wave Radio: Principle, Technology, and New Results", EURASIP Journal on Wireless Communications and Networking, vol. 2007, Article ID 68253, 8 pages, doi:10.1155/2007/68253.

* cited by examiner

*Primary Examiner* — Nhan Le
(74) *Attorney, Agent, or Firm* — McAndrew, Held & Malloy, Ltd.

(57) ABSTRACT

Aspects of a method and system for a distributed transceiver for high frequency applications may include generating a second signal from a first signal by frequency-translating the first signal via a plurality of conversion stages. Each of the plurality of conversion stages may frequency-translate a corresponding input signal by a local oscillator frequency or by a fraction of said local oscillator frequency. The first signal may be the corresponding input signal to an initial stage of a the plurality of conversion stages, an output signal of a previous one of the plurality of conversion stages may be the corresponding input signal to a subsequent one of the plurality of conversion stages, and the second signal may be an output signal of a final stage of the plurality of conversion stages.

20 Claims, 5 Drawing Sheets

METHOD AND SYSTEM FOR A DISTRIBUTED TRANSCEIVER FOR HIGH FREQUENCY APPLICATIONS

CROSS-REFERENCE TO RELATED APPLICATIONS/INCORPORATION BY REFERENCE

This application makes reference to:
U.S. application Ser. No. 11/860,251, filed on even date herewith;
U.S. application Ser. No. 11/860,269, filed on even date herewith;
U.S. application Ser. No. 11/860,234, filed on even date herewith;
U.S. application Ser. No. 11/860,281, filed on even date herewith; and
U.S. application Ser. No. 11/860,296, filed on even date herewith.

FIELD OF THE INVENTION

Certain embodiments of the invention relate to signal processing for communication systems. More specifically, certain embodiments of the invention relate to a method and system for a distributed transceiver for high frequency applications.

BACKGROUND OF THE INVENTION

In 2001, the Federal Communications Commission (FCC) designated a large contiguous block of 7 GHz bandwidth for communications in the 57 GHz to 64 GHz spectrum. This frequency band was designated for use on an unlicensed basis, that is, the spectrum is accessible to anyone, subject to certain basic, technical restrictions such as maximum transmission power and certain coexistence mechanisms. The communications taking place in this band are often referred to as '60 GHz communications'.

With respect to the accessibility of this designated portion of the spectrum, 60 GHz communications is similar to other forms of unlicensed spectrum use, for example Wireless LANs or Bluetooth in the 2.4 GHz ISM bands. However, communications at 60 GHz may be significantly different in aspects other than accessibility. For example, 60 GHz signals may provide markedly different communications channel and propagation characteristics, at least due to the fact that 60 GHz radiation is partly absorbed by oxygen in the air, leading to higher attenuation with distance. On the other hand, since a very large bandwidth of 7 GHz is available, very high data rates may be achieved. Among the applications for 60 GHz communications are wireless personal area networks, wireless high-definition television signal, for example from a set top box to a display, or Point-to-Point links.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for a distributed transceiver for high frequency applications, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a distributed transceiver for high frequency applications. Aspects of a method and system for a distributed transceiver for high frequency applications may comprise generating a second signal from a first signal by frequency-translating the first signal via a plurality of conversion stages. Each of the plurality of conversion stages may frequency-translate a corresponding input signal by a local oscillator frequency or by a fraction of said local oscillator frequency. The first signal may be the corresponding input signal to an initial stage of a the plurality of conversion stages, an output signal of a previous one of the plurality of conversion stages may be the corresponding input signal to a subsequent one of the plurality of conversion stages, and the second signal may be an output signal of a final stage of the plurality of conversion stages.

The plurality of conversion stages may be communicatively coupled in a cascade configuration. The first signal may be a radio frequency signal or an intermediate frequency signal and the second signal may be a baseband signal. The first signal may be a radio frequency signal or a baseband signal and the second signal may be an intermediate frequency signal. The first signal may be a baseband signal or an intermediate frequency signal and the second signal may be a radio frequency signal. The local oscillator frequency may be associated with a local oscillator signal and the fraction of the local oscillator frequency may be associated with a fractional local oscillator signal. The fractional local oscillator signal may be generated from the local oscillator signal by using one or more frequency dividers. Mixing the local oscillator and/or one or more mixing signals may generate the fractional local oscillator signal. The one or more mixing signals may be generated by dividing the local oscillator signal via one or more frequency dividers. The local oscillator may be a sinusoidal signal with a frequency equal to the local oscillator frequency.

Figure 1:
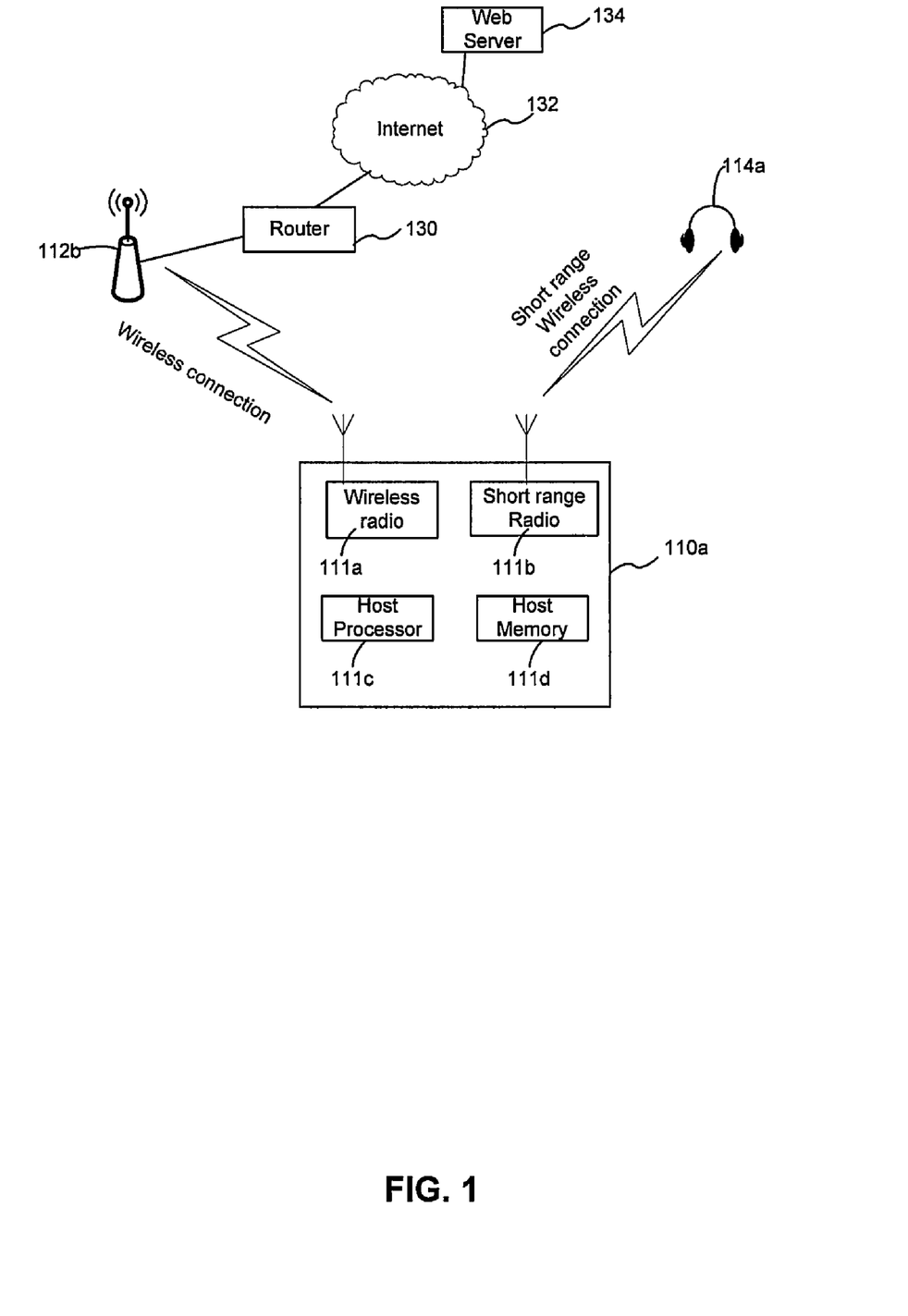
FIG. 1 is a diagram illustrating an exemplary wireless communication system, in connection with an embodiment of the invention.

FIG. 1 is a diagram illustrating an exemplary wireless communication system, in connection with an embodiment of the invention. Referring to FIG. 1, there is shown an access point 112b, a computer 110a, a headset 114a, a router 130, the Internet 132 and a web server 134. The computer or host device 110a may comprise a wireless radio 111a, a short-range radio 111b, a host processor 111c, and a host memory 111d. There is also shown a wireless connection between the wireless radio 111a and the access point 112b, and a short-range wireless connection between the short-range radio 111b and the headset 114a.

Frequently, computing and communication devices may comprise hardware and software to communicate using multiple wireless communication standards. The wireless radio 111a may be compliant with a mobile communications standard, for example. There may be instances when the wireless radio 111a and the short-range radio 111b may be active concurrently. For example, it may be desirable for a user of the computer or host device 110a to access the Internet 132 in order to consume streaming content from the Web server 134. Accordingly, the user may establish a wireless connection between the computer 110a and the access point 112b. Once this connection is established, the streaming content from the Web server 134 may be received via the router 130, the access point 112b, and the wireless connection, and consumed by the computer or host device 110a.

It may be further desirable for the user of the computer 110a to listen to an audio portion of the streaming content on the headset 114a. Accordingly, the user of the computer 110a may establish a short-range wireless connection with the headset 114a. Once the short-range wireless connection is established, and with suitable configurations on the computer enabled, the audio portion of the streaming content may be consumed by the headset 114a. In instances where such advanced communication systems are integrated or located within the host device 110a, the radio frequency (RF) generation may support fast-switching to enable support of multiple communication standards and/or advanced wideband systems like, for example, Ultrawideband (UWB) radio. Other applications of short-range communications may be wireless High-Definition TV (W-HDTV), from a set top box to a video display, for example. W-HDTV may require high data rates that may be achieved with large bandwidth communication technologies, for example UWB and/or 60-GHz communications.

Figure 2:
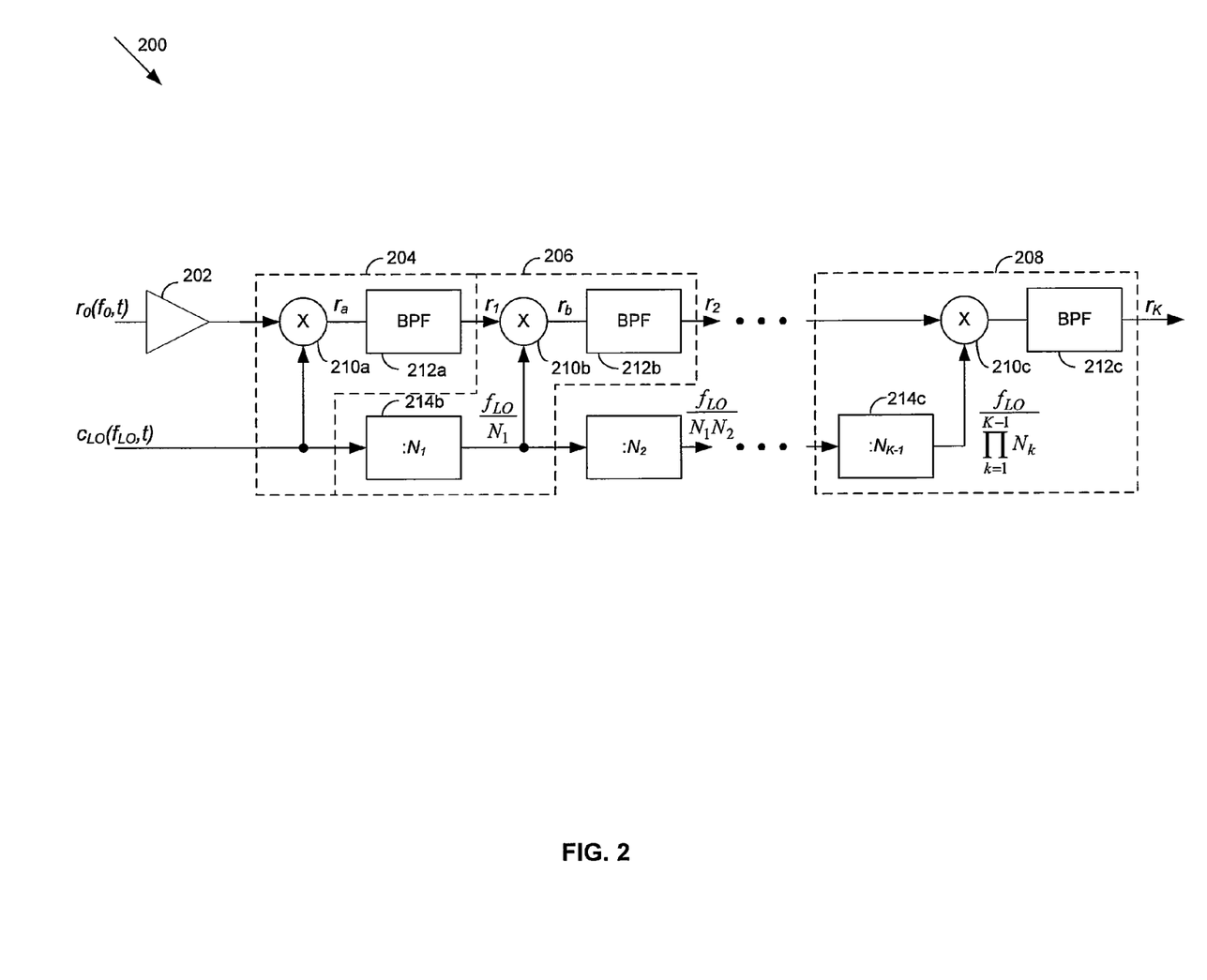
FIG. 2 is a block diagram of an exemplary RF demodulator for a high-frequency receiver, in accordance with an embodiment of the invention.

FIG. 2 is a block diagram of an exemplary RF demodulator for a high-frequency receiver, in accordance with an embodiment of the invention. Referring to FIG. 2, there is shown a demodulator 200 comprising an amplifier 202, and a plurality of down conversion stages, of which down conversion stages 204, 206 and 208 are illustrated. The down conversion stage 204 may comprise a multiplier 210a and a filter 212a. The down conversion stage 206 may comprise a multiplier 210b, a filter 212b and a frequency divider 214b. The down conversion stage 208 may comprise a multiplier 210c, a filter 212c and a frequency divider 214c. There is also shown a received signal $r_0(f_0,t)=r_0$ that may be a function of a carrier frequency $f_0$ and time t. The indices for frequency and time may be dropped for illustrative purposes. Similarly, there is shown $r_1, r_2, r_K, r_a, r_b$. A local oscillator signal $c_{LO}(f_{LO},t)=c_{LO}$ and a number of fractional local oscillator signals $c_{LO/N_1}, c_{LO/N_1N_2}, c_{LO/N_1N_2\ldots N_K}$ with frequency terms $$\frac{f_{LO}}{N_1}, \frac{f_{LO}}{N_1N_2} \text{ and } \frac{f_{LO}}{\prod_{k=1}^{K}N_k},$$

respectively, may be shown, which may illustrate various signals generated by frequency dividing the local oscillator (LO) signal $c_{LO}$.

The amplifier 202 may comprise suitable logic, circuitry and/or code that may be enabled to amplify a high-frequency RF signal at its input. The down conversion stages 204, 206 and 208 may be substantially similar and may comprise suitable logic, circuitry and/or code that may be enabled to down convert an input signal that may be modulated onto an RF carrier signal to an output signal that may be similar to the input signal but modulated onto lower frequency carrier signal. The multipliers 210a/b/c may comprise suitable logic, circuitry and/or code that may be enabled to multiply two RF input signals and generate an RF output signal that may be proportional to the product of its input signals. The filters 212a/b/c may comprise suitable logic, circuitry and/or code that may be enabled to attenuate a portion of the frequency spectrum of an input signal. The frequency dividers 214b/c may comprise suitable logic, circuitry and/or code that may be enabled to generate an output signal that may be similar to its input signal, divided in frequency. The frequency dividers may be implemented using Direct Digital Frequency Synthesis or integer (Miller) dividers, for example.

With reference to FIG. 2, there is shown a demodulator 200 that may be part of a high-frequency radio frequency receiver. An exemplary high-frequency received signal may be $r_0(f_0, t)=s(t)\cos(2\pi f_0 t+\phi(t))=s(t)\cos(w_0 t+\phi(t))$, where $f_0$ may be the carrier frequency and $2\pi f_0=w_0$ may be the corresponding angular frequency. The signal s(t) and the phase signal $\phi(t)$ may be, for example, the information-bearing baseband signal and the information-bearing phase signal, respectively, that may be modulated onto the carrier $\cos(w_0 t)$. In this instance, $r_0(f_0,t)$ may be an inphase bandpass signal component and a similar block diagram as illustrated for demodulator 200 may also be used for a demodulator of a quadrature bandpass signal component. In some instances, the received signal $r_0$ may be at a high carrier frequency, for example, $f_0$=60 GHz. In these instances, it may be difficult to generate a local oscillator signal $c_{LO}$, for example with a Phase-locked loop (PLL), sufficiently high in frequency to achieve demodulation to baseband or, in some instances, to an intermediate frequency. In addition, high frequency LO signals may generally be undesirable for distribution in a system since the signal transport over conductors may result in transmission line problems, due to the LO signal's high frequency content. Hence, it may be desirable to generate the high frequency signal for demodulation of the RF signal in proximity to the received high frequency signal $r_0(f_0,t)$. In these instances, it may be desirable to generate a local oscillator signal $c_{LO}$ that may be significantly lower in frequency, for example, $f_{LO}$=20 GHz, than the carrier of the received signal at, for example $f_0$=60 GHz. In accordance with various embodiments of the invention, a plurality of conversion stages, for example down conversion stages 204, 206 and 208 may then be used to down convert the received signal $r_0$ to baseband and/or intermediate frequency.

An exemplary received signal $r_0$ may be amplified by a factor z in the amplifier 202 to generate a signal at the input to the multiplier 210a, given by $r'_0(f_0,t)=z \cdot r_0(f_0,t)=z \cdot s(t)\cos(w_0 t+\phi(t))$. The multiplier 210a may multiply the signals $r'_0$ with the local oscillator signal $c_{LO}=\cos(w_{LO}t)$, to generate $r_a$ according to the following relationship:

$$r_a = r'_0(f_0, t)c_{LO}(f_0, t)$$

$$= z \cdot s(t)\cos(w_0 t + \phi(t))\cos(w_{LO}t)$$

$$= \frac{z}{2} \cdot s(t)[\cos(w_0 t + \phi(t) + w_{LO}t) + \cos(w_0 t + \phi(t) - w_{LO}t)]$$

Hence, as may be seen from the above equation, the signal $r_a$ may comprise a sum and a difference term at frequencies determined by the difference of the carrier frequency $w_0$ and the local oscillator frequency $w_{LO}$. In this instance, in accordance with an embodiment of the invention, it may be desirable to demodulate the received signal $r_0$ and hence it may be desirable to retain only the lower frequency component, modulated onto a carrier at frequency $w_0 - w_{LO}$. This may be achieved by the filter 212a, which may reject the higher of the frequency terms to generate $r_1$, given by the following relationship:

$$r_1 = BPF_{212a}(r_a) = \frac{z}{2}s(t)[\cos(w_0 t + \phi(t) - w_{LO}t)]$$

In an additional down conversion stage, for example down conversion stage 206, the generated signal $r_1$, may be down converted further. This may be achieved in a similar manner by down converting $r_1$ with a frequency-divided local oscillator signal. Specifically, as illustrated in FIG. 2, the down converted output signal $r_1$ from down conversion stage 204 may be multiplied with a signal that may be a frequency divided version of the local oscillator at the output of the frequency divider 214b, namely $$c_{LO/N_1} = \cos\left(\frac{w_{LO}}{N_1}t\right).$$

The divisor, $N_1$, applied in frequency divider 214b may be arbitrary. In many instances, it may be desirable to choose $N_1$ a rational number or an integer. A signal $r_b$ may be generated at the output of multiplier 210b that may be given by the following relationship:

$$r_b = r_1 \cdot c_{LO/N_1} \quad (1)$$
$$= \frac{z}{2}s(t)[\cos(w_0 t + \phi(t) - w_{LO}t)]\cos\left(\frac{w_{LO}}{N_1}t\right)$$
$$= \frac{z}{4}s(t)\begin{bmatrix}\cos\left(w_0 t + \phi(t) - w_{LO}t + \frac{w_{LO}}{N_1}t\right) + \\ \cos\left(w_0 t + \phi(t) - w_{LO}t - \frac{w_{LO}}{N_1}t\right)\end{bmatrix}$$

Similar to generating $r_1$, $r_2$ at the output of the down conversion stage 206 may be generated by applying suitable filtering to $r_b$, which may remove the higher frequency component in filter 212b, to obtain:

$$r_2 = \frac{z}{4}s(t)\cos\left(w_0 t + \phi(t) - w_{LO}t - \frac{w_{LO}}{N_1}t\right)$$

Further down modulating may be achieved by applying further down conversion stages similar to down conversion stage 206, for example. As illustrated in FIG. 2, it may be desirable to use a cascade of K down conversion stages. In this case, the output signal $r_K$ after K down conversion stages may be given, for example, by the following relationship:

$$r_K = \frac{z}{2^K}s(t)\cos\left(w_0 t + \phi(t) - w_{LO}\left(1 + \sum_{k=1}^{K-1}\frac{1}{\prod_{n=1}^{k}N_n}\right)t\right) \quad (2)$$

In these instances, it may be that the filters in the down conversion stages, for example filters 212a/b/c may be filtering in order to attenuate the higher frequency component at their input. In this instance, $N_k > 0 \forall k \in 1, 2, \ldots K-1$.

In some instances and for some down conversion stages, it may be desirable to choose to retain the higher frequency component rather than the lower frequency component of the output signal of the multiplier, in order to get a desirable output at the filter. For example, in accordance with various embodiments of the invention, the higher frequency component in $r_b$, equation (1), for example, may be retained by appropriately filtering $r_b$ in filter 212b. In this instance, from equation (1), $r_2$ may be given by the following relationship:

$$r_2 = \frac{z}{4}s(t)\cos\left(w_0 t + \phi(t) - w_{LO}t + \frac{w_{LO}}{N_1}t\right) \quad (3)$$

In a general case, either the higher or the lower frequency component may be selected for each down conversion stage. As illustrated in equation (3), this may result in the sign of the frequency term corresponding to a particular down conversion stage to change. Hence, for K down conversion stages, the output $r_K$ may be described by equation (2), wherein the coefficients $N_k$ may be positive or negative, as appropriate.

In one embodiment of the invention, the divisors $N_k$ may be chosen equal, so that $N_k = N \forall k$. In these instances, equation (2) may be given by the following relationship:

$$r_K = \frac{z}{2^K}s(t)\cos\left(w_0 t + \phi(t) - w_{LO}t\sum_{k=0}^{K-1}\left(\frac{1}{N}\right)^k\right) \quad (4)$$

By choosing $z = 2^K$, which may be achieved, for example, by amplifying by a factor of two at each down conversion stage, it may be observed that the expression in equation (4) may be stable and converge for an arbitrary number of stages when $|1/N| < 1$, so that the limit of (4) may be given by the following relationship:

$$r_K\big|_{z=2^K} = s(t)\cos\left(w_0 t + \phi(t) - w_{LO}t\sum_{k=0}^{K-1}\left(\frac{1}{N}\right)^k\right) \quad (5)$$

$$r_K\big|_{z=2^K} \xrightarrow{K\to\infty} s(t)\cos\left(w_0 t + \phi(t) - \frac{w_{LO}t}{1 - 1/N}\right) =$$

$$s(t)\cos\left(w_0 t + \phi(t) - \frac{N \cdot w_{LO}t}{N-1}\right)$$

where equation (5) may converge more rapidly for larger N. For example, if N=4, the frequency term in equation (5) may converge to $w_0 t - 1.\overline{3} \cdot w_{LO}t$ as $K \to \infty$. However, as may be observed from the first line of equation (5), with K=3, the frequency term may already be $w_0 t - 1.3125 \cdot w_{LO}t$ and hence the frequency correction term may be approximately $$\frac{1.3125}{1.3} = 63/64 \approx 98.5\%$$

of the desired frequency correction term.

In accordance with various embodiments of the invention, the number of down conversion stages may be arbitrary. Moreover, in some instances, it may be desirable that the first down conversion stage, for example down conversion stage 204 may comprise a frequency divider, similar, for example, to down conversion stage 206 and/or down conversion stage 208. The number of down conversion stages K may be determined, for example, based on the difference between $w_0$ and $w_{LO}$, and the desired intermediate frequencies. In some instances, it may be possible that the divisors may be software-programmable. Moreover, the structure illustrated in FIG. 2 may be used by a modulator, whereby the sum terms instead of the difference terms may be retained in order to obtain an output signal at a higher frequency that the input signal. For example, in equation (1), the higher frequency component may be retained by the filter 212b in the down conversion stage 206, whereby the down conversion stage 206 may effectively become an up conversion stage, as illustrated in equation (3).

Figure 3:
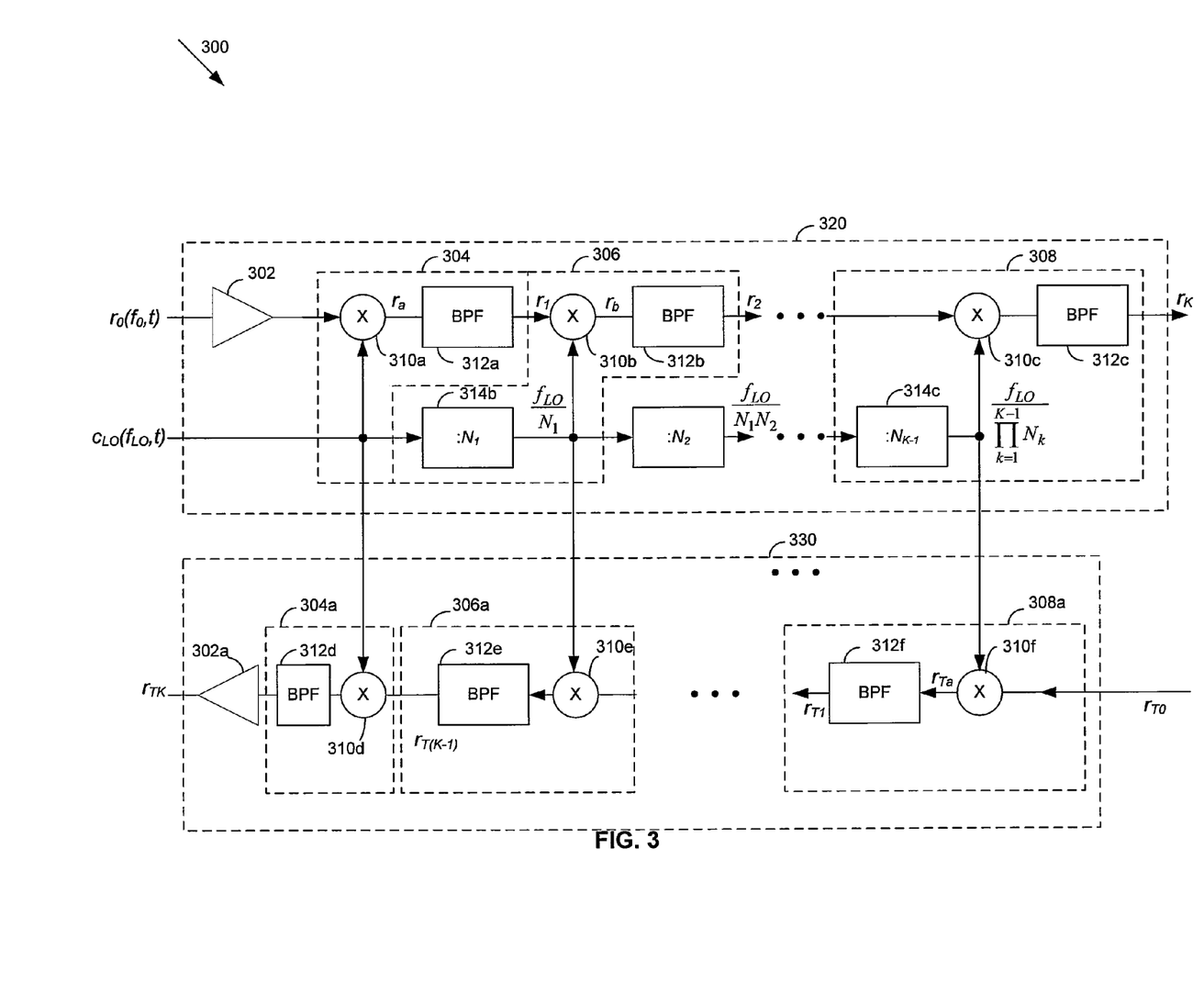
FIG. 3 is a block diagram of an exemplary RF modulator and demodulator for a high-frequency transceiver, in accordance with an embodiment of the invention.

FIG. 3 is a block diagram of an exemplary RF modulator and demodulator for a high-frequency transceiver, in accordance with an embodiment of the invention. Referring to FIG. 3, there is shown a modulator/demodulator system 300 comprising a demodulator 320 and a modulator 330. The demodulator 320 may be substantially similar to the demodulator 200 illustrated in FIG. 2. The elements of demodulator 320 may be similar to their corresponding elements in demodulator 200. Specifically, elements 302, 304, 306, 308, 310a/b/c, 312a/b/c and 314b/c may be similar to elements 202, 204, 206, 208, 210a/b/c, 212a/b/c and 214b/c, respectively.

The modulator 330 may comprise an amplifier 302a, and a plurality of up conversion stages, of which up conversion stages 304a, 306a and 308a may be illustrated. The modulator 330 may comprise suitable logic, circuitry and/or code that may be enabled to modulate an input signal, $r_{T0}$, to radio frequency, $r_{TK}$. The sub-script 'T' may indicate a transmit signal associated with the modulator 330. The up conversion stage 304a, 306a and 308a may comprise filters 312d/e/f and multipliers 310d/e/f, respectively. There is also shown a transmit signal $r_{T0}(f_{T0},t)=r_{T0}$ that may be a function of frequency $f_{T0}$ and time t. The indices for frequency and time may be dropped for illustrative purposes. Similarly, there is shown $r_{T1}, r_{T(K-1)}, r_{TK}$, which may be the output signals of up conversion stages 1, (K−1) and K, respectively.

The functionality of the modulator 330 may be considered similar to the demodulator 320 functionality in reverse. In particular, whereas in the demodulator 320, the input signal $r_0$ may be a signal modulated onto a radio frequency carrier or an intermediate frequency carrier for frequency translation to a lower frequency, the input signal of the modulator 330 may be a baseband signal or an intermediate frequency signal for frequency translation to a higher frequency, for example to intermediate frequency or radio frequency, respectively. However, the frequency up conversion may be achieved similarly to the frequency down conversion. The main difference may be found in the filtering, wherein the higher frequency components may be retained, as described for equation (3) and FIG. 2. For example, in up conversion stage 308a, the output signal $r_{T1}$ may be given by the following relationship:

$$r_{Ta} = r_{T0} \cdot c_{LO/(N_1 \cdot N_2 \cdot \ldots \cdot N_{K-1})} \qquad (6)$$

$$= x(t)[\cos(w_{T0}t + \Phi(t))]\cos\left(\frac{w_{LO}}{\prod_{k=1}^{K-1} N_k}t\right)$$

$$= \frac{1}{2}x(t)\begin{bmatrix}\cos\left(w_{T0}t + \Phi(t) - \frac{w_{LO}}{\prod_{k=1}^{K-1} N_k}t\right) + \\ \cos\left(w_{T0}t + \Phi(t) + \frac{w_{LO}}{\prod_{k=1}^{K-1} N_k}t\right)\end{bmatrix}$$

where $w_{T0}=2\pi f_{T0}$ may be the angular frequency of the input signal $r_{T0}=x(t)\cos(w_{T0}t+\Phi(t))$, wherein $x(t)$ may be the information bearing baseband signal, and $\Phi(t)$ may be the information-bearing phase signal, similar to $s(t)$ and $\phi(t)$, respectively, for the received signal. For an up conversion stage, for example up conversion stage 308a, the filter 312f may maintain, for example, the higher of the frequency components of $r_{Ta}$ from equation (6), so that $r_{T1}$ may be given by the following relationship:

$$r_{T1} = BPF_{312f}(r_{Ta}) = \frac{1}{2}x(t)\cos\left(w_{T0}t + \Phi(t) + \frac{w_{LO}}{\prod_{k=1}^{K-1} N_k}t\right) \qquad (7)$$

Similar to FIG. 2, the filter 312f may be an arbitrary filter and may retain, for example, the lower and/or higher frequency components comprised in its input signal, and may not be limited to the expression provided in equation (7).

In accordance with an embodiment of the invention, the modulator 330 may share the frequency dividers, for example frequency dividers 314b/c, with the demodulator 320, the modulator 330 may be configured in a manner that may provide the same up conversion frequency steps that may be provided in the down conversion. In particular, if the filter in a down conversion stage may retain the lower frequency component, by retaining the higher frequency component in the corresponding up conversion stage, the up conversion signal may be upconverted in frequency by the same amount as a down conversion signal may be downconverted in frequency by the corresponding down conversion stage. For example, as described for FIG. 2, the received signal $r_0$ may be down converted from angular frequency $w_0$ to $w_1=w_0-w_{LO}$ for signal $r_1$ in down conversion stage 304. Similarly, the signal $r_{T(K-1)}$ at angular frequency $w_{T(K-1)}$ may be converted by the corresponding up conversion stage 304a to angular frequency $w_{TK}=w_{T(K-1)}+w_{LO}$. Hence, by appropriately choosing the filters in both the demodulator 320 and the modulator 330, the frequency translation across the entire modulator may be chosen approximately equal across the entire demodulator, for example, in opposite directions. In one exemplary embodiment of the invention, the received signal $r_0$, for example, may be down converted by 40 GHz from $r_0$ to $r_K$, and the transmit signal $r_{T0}$ may be up converted by 40 GHz from at $r_{T0}$ to $r_{TK}$.

In some instances, the high-frequency transceiver in FIG. 3 may operate in a time division duplex (TDD) mode, whereby a signal may be generated for transmission in the modulator 330, for example $r_{TK}$, or a signal may be received in demodulator 320, for example $r_0$. At any instance in time, the high-frequency transceiver 300 may either be receiving or transmitting, but not both, in accordance with an embodiment of the invention. In these instances, the frequency dividers, for example the frequency divider 314b and/or 314c, may be programmable and may use different divisors N, depending on whether the transceiver may be in transmit or receive mode. Accordingly, because different divisors may be used as a function of the mode of operation, the transmit carrier frequency $f_K$ for the transmit signal $r_{TK}(f_K,t)$ may be chosen different from the receive frequency $f_0$ in the receive signal $r_0$ in some instances. In this mode of operation, sharing programmable frequency dividers as illustrated in FIG. 3 may permit the transceiver system 300 to operate in a combined TDD/FDD mode, where different frequencies may be used in the modulator 330 and the demodulator 320, depending on the operation mode that may change as a function of time.

Figure 4:
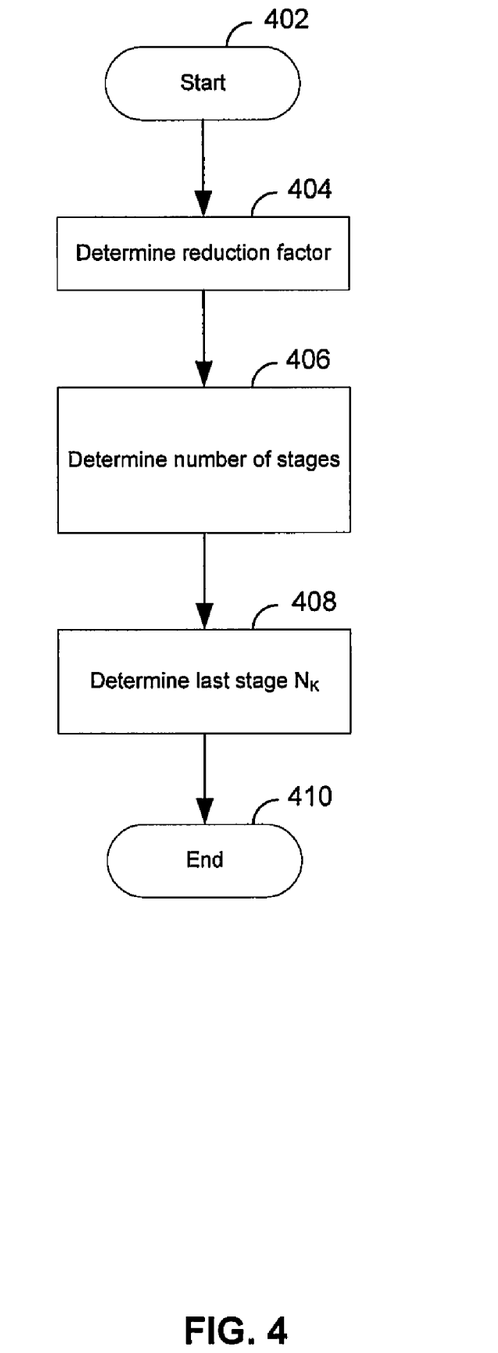
FIG. 4 is a flowchart, illustrating an exemplary determination of the down conversion factors of a demodulator, in accordance with an embodiment of the invention.

FIG. 4 is a flowchart, illustrating an exemplary determination of the down conversion factors of a demodulator, in accordance with an embodiment of the invention. In accordance with the description for FIG. 2 and FIG. 3, it is understood by one skilled in the art that there are a large number of approaches that may be chosen to determine a number of frequency conversion stages and appropriate frequency conversion factors. With reference to FIG. 4, there is shown one approach that may be used to determine a number of frequency conversion stages and the associated conversion factors and/or divisors.

In accordance with an exemplary embodiment of the invention, determination of a down conversion system, for example a demodulator similar to FIG. 2, may be illustrated in FIG. 4. Initially, in step 404, a reduction factor may be determined. The reduction factor, for example x, may be determined by the difference between the frequency of the carrier of the received signal, $w_0$, and the desired carrier frequency at the output of the demodulator, $w_K$. The reduction factor may be expressed in terms of local oscillator frequency, as given by the following relationship:

$$x = \frac{w_0 - w_K}{w_{LO}}$$

Based on the reduction factor, the number of stages according to this exemplary approach may be determined as given by the following relationship, in step 406:

$$K = \lceil x \rceil$$

where the operation $\lceil . \rceil$ may denote 'the nearest greater integer'. In this instance, for K conversion stages, K−1 conversion stages may be chosen such that $N_k = 1 \forall k \in 0, 1, \ldots K-1$. The down conversion factor $N_K$ of the K-th down conversion stage may correspondingly be chosen, in step 408, as $0 < N_K < 1$ and may be given by the following relationship:

$$N_K \approx \frac{1}{x - \lfloor x \rfloor}$$

where the operation $\lfloor . \rfloor$ may denote 'the nearest smaller integer', and the operation '$\approx$' may be interpreted as 'a sufficiently close rational number', in accordance with the accuracy that may be required in the system.

In an exemplary embodiment of the invention, in instances where $w_0$ may be 60 GHz, the target frequency $w_K$ may be 1 GHz, and the local oscillator frequency $w_{LO}$ may be 8 GHz, x=7.375. Hence, it may be desirable to use K=8 stages. Hence, $$N_k = 1 \forall k \in 0, 1, \ldots 6 \text{ and } N_K = 0.375 = \frac{3}{8}.$$

Figure 5:
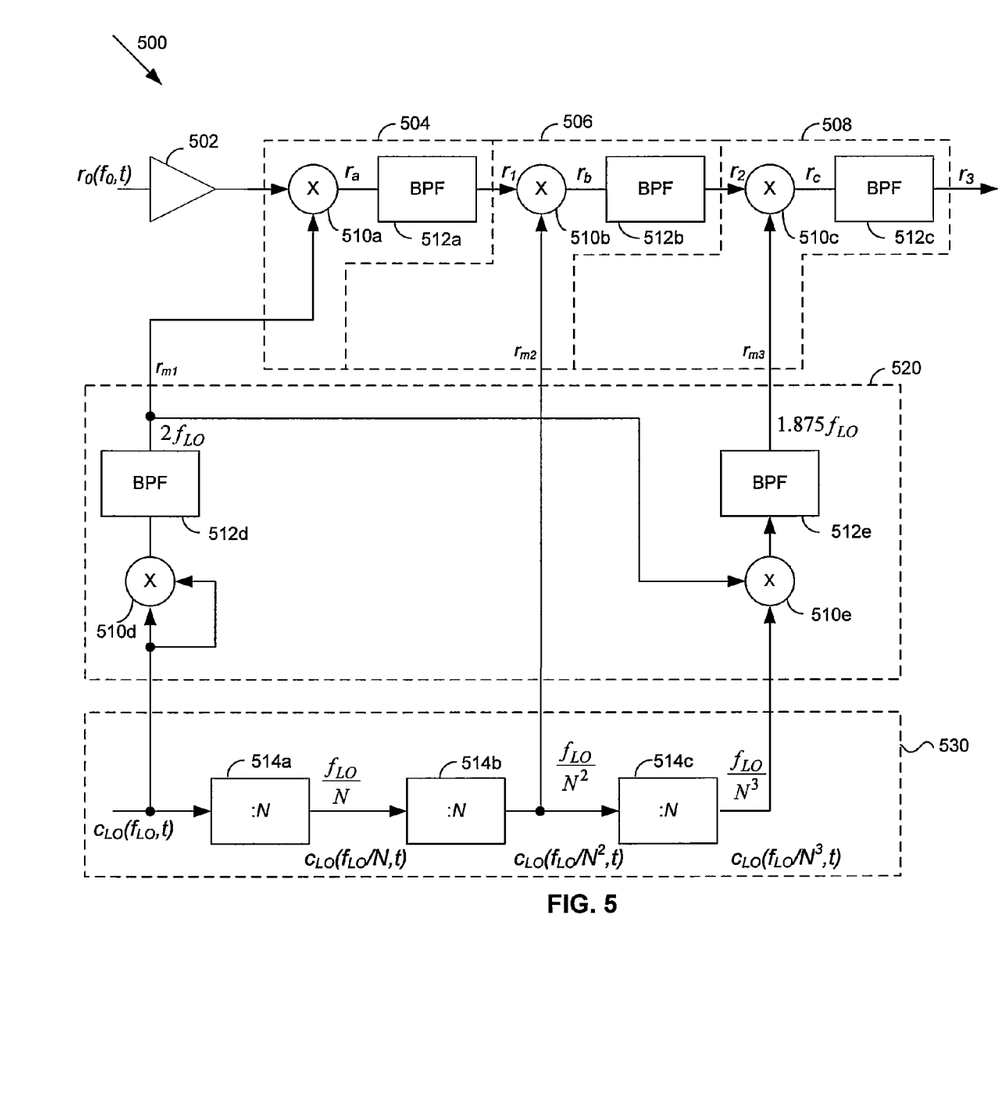
FIG. 5 is a diagram of an exemplary demodulator with local oscillator frequency mixing, in accordance with an embodiment of the invention.

FIG. 5 is a diagram of an exemplary demodulator with local oscillator frequency mixing, in accordance with an embodiment of the invention. Referring to FIG. 5, there is shown a demodulation system 500 comprising an amplifier 502, down conversion stages 504, 506 and 508, an LO mixer 520 and a fractional LO cascade 530. The down conversion stages 504, 506 and 508 may comprise multipliers 510a/b/c and filters 512a/b/c, respectively. The LO mixer 520 may comprise filters 512d/e and multipliers 510d/e. The fractional LO cascade 530 may comprise frequency dividers 514a/b/c. There is also shown a received signal $r_0(f_0,t)=r_0$ that may be a function of a receive carrier frequency $f_0$ and time t. The indices for frequency and time may be dropped for illustrative purposes. Similarly, there is shown $r_1,r_2,r_3,r_a,r_b,r_c,r_{m1},r_{m2},r_{m3}$. A local oscillator signal $c_{LO}(f_{LO},t)=c_{LO}$ may be shown and a number of frequency terms $$\frac{f_{LO}}{N_1}, \frac{f_{LO}}{N_1 N_2} \text{ and } \frac{f_{LO}}{\prod_{k=1}^{K} N_k},$$

which may illustrate various signals generated by frequency dividing the local oscillator (LO) signal $c_{LO}$, for example, $c_{LO}(f_{LO}/N,t), c_{LO}(f_{LO}/N^2,t)$ and $c_{LO}(f_{LO}/N^3,t)$.

In some instances, the type of frequency divider, for example 214b/c, may be constrained due to a particular implementation. For example, it may be possible that $N_k \in \square^+$. In this regard, the divisors may be chosen only from among the set of positive integers. In another embodiment of the invention illustrated in FIG. 5, the frequency divider may be more constrained and $N_k = N \forall k$, for example. Notwithstanding, in accordance with an embodiment of the invention, high precision may be achieved even for fixed $N_k = N$, in some instances at the expense of an LO mixer 520. For example, when $N = N_k = 2 \forall k$, from equation (5), for example, one may see that the frequency term may converge to $$K \rightarrow \infty: w_0 t - \frac{N}{N-1} \cdot w_{LO} t = w_0 t - 2 w_{LO} t,$$

where the phase term $\phi(t)$ may be omitted for illustrative purposes. For different number of stages K, it may be seen from the following table how the term correction term $$\frac{N}{N-1}$$

may converge:

| K | Correction term $\frac{N}{N-1}$ | Error term w.r.t $K = \infty$ (in %) | Difference between adjacent stages |
|---|---|---|---|
| 0 | 1 | 50 | 1 |
| 1 | 1.5 | 25 | 0.5 |
| 2 | 1.75 | 12.5 | 0.25 |
| 3 | 1.875 | 6.25 | 0.125 |

-continued

| K | Correction term $\frac{N}{N-1}$ | Error term w.r.t $K = \infty$ (in %) | Difference between adjacent stages |
|---|---|---|---|
| 4 | 1.9375 | 3.125 | 0.0625 |
| 5 | 1.96875 | 1.5625 | 0.03125 |
| 6 | 1.984375 | 0.78125 | 0.015625 |
| 7 | 1.992188 | 0.390625 | 0.007813 |
| 8 | 1.996094 | 0.195313 | 0.003906 |
| 9 | 1.998047 | 0.097656 | 0.001953 |
| 10 | 1.999023 | 0.048828 | 0.000977 |

Hence, as may be seen from the above second column, by increasing the number of down conversion stages, the correction term may be chosen arbitrarily close to 2, as may be seen from column 3 of the above table. For example, for K=2, a 12.5% error with respect to K=∞ may be obtained. Hence, in cases where the correction term $$\frac{N}{N-1}$$

may be chosen as an integer greater or equal to 2, arbitrary accuracy may be achieved easily. For example in the system illustrated in FIG. 2, to approximate a correction factor of 5=3+2, stages $N_k=1$; k∈0,1,2, to obtain the factor 3, followed by an arbitrary number of stages with $N_k=2 \forall k$: k>2, to get arbitrarily close to 5.

In order to generate arbitrary frequency correction terms based on a fixed divisor factor $N_k = N \forall k$, an LO mixer 520 may be used together with the fractional LO cascade 530. The fractional LO cascade 530 may comprise suitable logic, circuitry and/or code that may be enabled to accept a local oscillator input signal $c_{LO}(f_{LO}, t)$ and frequency divide it in a cascade of frequency dividers, for example 514a/b/c, to generate fractional local oscillator signals, for example $c_{LO}(f_{LO}/N, t), c_{LO}(f_{LO}/N^2, t)$ and $c_{LO}(f_{LO}/N^3, t)$, respectively. By appropriately mixing these fractional local oscillator signals, small frequency differences may be generated that may be used in the down conversion stages. The resolution, or frequency steps, obtainable may depend on the number of frequency dividers in the fractional LO cascade 530. For example, the exemplary embodiment illustrated in FIG. 5 may comprise 3 frequency dividers 514a/b/c and N=2 may be set. By appropriately multiplying and filtering various fractional LO terms obtained in the fractional LO cascade 530 in the LO mixer 520, arbitrary down conversion factors may be achieved in the down conversion stages, for a sufficient number of frequency dividers in the LO cascade 530.

For example, the exemplary embodiment illustrated in FIG. 5 may result in an overall down conversion factor of 4.125, that is, $r_3 \propto \cos(w_0 t + \phi(t) - 4.125 w_{LO} t)$. In the LO mixer 520, the multiplier 510d may be communicatively coupled to $c_{LO}$, and the output of the multiplier 510d may be given by the following relationship:

$$c_{LO} \cdot c_{LO} = \cos^2(w_{LO} t) = \frac{1}{2}[\cos(2w_{LO} t) + 1]$$

Similar to the filtering described for FIG. 2, the filter 512d may retain the low-frequency or high frequency component. In this particular instance, the filter 512d may retain the high-frequency component and generate, at its output a signal $r_{m1}$, given by the following relationship:

$$r_{m1} = BPF_{512d} = \frac{1}{2}\cos(2w_{LO} t)$$

The signal $r_{m1}$ may be communicatively coupled to the multiplier 510a in the down conversion stage 504. Similarly, the output of frequency divider 514b may be coupled to the input of the multiplier 510b, so that $$r_{m2} = c_{LO}\left(\frac{w_{LO}}{N^2}, t\right).$$

It may be observed from FIG. 5 that the output of frequency divider 514b may be directly coupled to the down conversion stage 506 and may not be mixed beforehand in the LO mixer 520. Similarly, it may be observed that the output of the frequency divider 514a may not be coupled to the LO mixer 520 or a down conversion stage, in this embodiment of the invention. Instead, the output of frequency divider 514a may be used as the input to the frequency divider 514b.

The output of the frequency divider 514c may be communicatively coupled to an input of the multiplier 510e. The second input of the multiplier 510e may be coupled to the output of the filter 512d. Hence, the output of the multiplier 510e in the LO mixer may be described by the following relationship:

$$c_{LO/N^3} \cdot r_{m1} = \frac{1}{2}\cos(2w_{LO} t)\cos\left(\frac{w_{LO}}{N^3} t\right)$$

$$= \frac{1}{4}\left[\cos\left(2w_{LO} t + \frac{w_{LO}}{N^3} t\right) + \cos\left(2w_{LO} t - \frac{w_{LO}}{N^3} t\right)\right]$$

By retaining the lower frequency component from the output signal of 510e in the filter 512e, the output signal of the filter 512e may be given by the following relationship:

$$r_{m3} = BPF_{512e}(c_{LO/N^3} \cdot r_{m1})$$

$$= \frac{1}{4}\cos\left(2w_{LO} t - \frac{w_{LO}}{8} t\right)$$

$$= \frac{1}{4}\cos(1.875 w_{LO} t)$$

In the down conversion stage 504, the output signal $r_1$ may be given by the following relationship:

$$r_1 = BPF_{512a}(z r_0 r_{m1}) = \frac{z}{4} s(t)\cos(w_0 t + \phi(t) - 2 w_{LO} t)$$

where the filter 512a may be chosen to retain the lower frequency component and $r_0 = s(t)\cos(w_0 t)$. z may be the amplification factor introduced by amplifier 502, similar to the description for FIG. 2. Correspondingly, the output of the down conversion stage 506 may be given by the following relationship:

$$r_2 = BPF_{512b}(r_1 r_{m2}) = \frac{z}{8} s(t)\cos\left(w_0 t + \phi(t) - 2 w_{LO} t - \frac{w_{LO} t}{4}\right)$$

where the filter 512b may have retained the lower frequency component. The output of the down conversion stage 508 may be given by the following relationship:

$$r_3 = BPF_{512c}(r_2 r_{m3})$$
$$= \frac{z}{64}s(t)\cos\left(w_o t + \phi(t) - 2w_{LO}t - \frac{w_{LO}t}{4} - 1.875 w_{LO}t\right)$$
$$r_3|_{z=64} = s(t)\cos(w_0 t + \phi(t) - 4.125 w_{LO}t)$$

Hence, as described above, the output signal $r_3$ that may be generated by the down conversion stages, may be frequency translated by a factor of 4.125. By appropriately choosing the number of frequency dividers in the fractional LO cascade 530 and suitably combining the outputs of the frequency dividers in the LO mixer 520, an arbitrary down conversion (frequency translation) factor may be achieved. In various embodiments of the invention, a similar approach may be used for a modulator by appropriate filtering in the conversion stages 504, 506 and 508, as described above and with respect to FIG. 2.

In accordance with an embodiment of the invention, a method and system for a distributed transceiver for high frequency applications may comprise generating a second signal from a first signal for example $r_K$, by frequency-translating the first signal, for example $r_0$, via a plurality of conversion stages, as illustrated in FIG. 2, FIG. 3 and FIG. 5. Each of the plurality of conversion stages, for example conversion stages 204, 206 and 208, may frequency-translate a corresponding input signal by a local oscillator frequency or by a fraction of said local oscillator frequency, as described for FIG. 2. The first signal may be the corresponding input signal to an initial stage of a the plurality of conversion stages, an output signal of a previous one of the plurality of conversion stages may be the corresponding input signal to a subsequent one of the plurality of conversion stages, and the second signal may be an output signal of a final stage of the plurality of conversion stages.

The plurality of conversion stages may be communicatively coupled in a cascade configuration, as illustrated in FIG. 5. The first signal may be a radio frequency signal or an intermediate frequency signal and the second signal may be a baseband signal. The first signal may be a radio frequency signal or a baseband signal and the second signal may be an intermediate frequency signal. The first signal may be a baseband signal or an intermediate frequency signal and the second signal may be a radio frequency signal, as described for FIG. 2. The local oscillator frequency, for example $w_{LO}$, may be associated with a local oscillator signal, for example $c_{LO}$ and the fraction of the local oscillator frequency, for example $w_{LO}/N$, may be associated with a fractional local oscillator signal, for example $c_{LO/N}$. The fractional local oscillator signal may be generated from the local oscillator $c_{LO}$ signal by using one or more frequency dividers, for example 514a/b/c. Mixing the local oscillator and/or one or more mixing signals may generate the fractional local oscillator signal, as illustrated in FIG. 2, for example. The one or more mixing signals may be generated by dividing the local oscillator signal via one or more frequency dividers. The local oscillator may be a sinusoidal signal with a frequency equal to the local oscillator frequency.

Another embodiment of the invention may provide a machine-readable storage, having stored thereon, a computer program having at least one code section executable by a machine, thereby causing the machine to perform the steps as described above for a method and system for a distributed transceiver for high frequency applications.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
   generating a second signal from a first signal by:
      frequency-translating said first signal via a plurality of conversion stages, wherein:
         each of said plurality of conversion stages frequency-translates a corresponding input signal by a local oscillator frequency or by a fraction of said local oscillator frequency; and
         said first signal is said corresponding input signal to an initial stage of a said plurality of conversion stages, an output signal of a previous one of said plurality of conversion stages is said corresponding input signal to a subsequent one of said plurality of conversion stages, and said second signal is an output signal of a final stage of said plurality of conversion stages.

2. The method according to claim 1, wherein said plurality of conversion stages are communicatively coupled in a cascade configuration.

3. The method according to claim 1, wherein said first signal is a radio frequency signal or an intermediate frequency signal and said second signal is a baseband signal.

4. The method according to claim 1, wherein said first signal is a radio frequency signal or a baseband signal and said second signal is an intermediate frequency signal.

5. The method according to claim 1, wherein said first signal is a baseband signal or an intermediate frequency signal and said second signal is a radio frequency signal.

6. The method according to claim 1, wherein said local oscillator frequency is associated with a local oscillator signal and said fraction of said local oscillator frequency is associated with a fractional local oscillator signal.

7. The method according to claim 6, comprising generating said fractional local oscillator signal from said local oscillator signal by using one or more frequency dividers.

8. The method according to claim 6, comprising mixing said local oscillator signal and/or one or more mixing signals to generate said fractional local oscillator signal.

9. The method according to claim 8, comprising dividing said local oscillator signal via one or more frequency dividers to generate said one or more mixing signals.

10. The method according to claim 6, wherein said local oscillator signal is a sinusoidal signal with a frequency equal to said local oscillator frequency.

11. A system for processing communication signals, the system comprising:
one or more circuits, said one or more circuits enabled to generate a second signal from a first signal by:
frequency-translating said first signal via a plurality of conversion stages, wherein:
each of said plurality of conversion stages frequency-translates a corresponding input signal by a local oscillator frequency or by a fraction of said local oscillator frequency; and
said first signal is said corresponding input signal to an initial stage of a said plurality of conversion stages, an output signal of a previous one of said plurality of conversion stages is said corresponding input signal to a subsequent one of said plurality of conversion stages, and said second signal is an output signal of a final stage of said plurality of conversion stages.

12. The system according to claim 11, wherein said plurality of conversion stages are communicatively coupled in a cascade configuration.

13. The system according to claim 11, wherein said first signal is a radio frequency signal or an intermediate frequency signal and said second signal is a baseband signal.

14. The system according to claim 11, wherein said first signal is a radio frequency signal or a baseband signal and said second signal is an intermediate frequency signal.

15. The system according to claim 11, wherein said first signal is a baseband signal or an intermediate frequency signal and said second signal is a radio frequency signal.

16. The system according to claim 11, wherein said local oscillator frequency is associated with a local oscillator signal and said fraction of said local oscillator frequency is associated with a fractional local oscillator signal.

17. The system according to claim 16, wherein said one or more circuits generate said fractional local oscillator signal from said local oscillator signal by using one or more frequency dividers.

18. The system according to claim 16, wherein said one or more circuits mix said local oscillator signal and/or one or more mixing signals to generate said fractional local oscillator signal.

19. The system according to claim 18, wherein said one or more circuits divide said local oscillator signal via one or more frequency dividers to generate said one or more mixing signals.

20. The system according to claim 16, wherein said local oscillator signal is a sinusoidal signal with a frequency equal to said local oscillator frequency.

* * * * *